United States Patent
Hace et al.

(10) Patent No.: US 9,500,405 B2
(45) Date of Patent: Nov. 22, 2016

(54) CONVECTIVE WAFER HEATING BY IMPINGEMENT WITH HOT GAS

(71) Applicants: Iztok Hace, Villach (AT); Martin Navarre, Villach (AT)

(72) Inventors: Iztok Hace, Villach (AT); Martin Navarre, Villach (AT)

(73) Assignee: LAM RESEARCH AG, Villach (AT)

( * ) Notice: Subject to any disclaimer, the term of this patent is extended or adjusted under 35 U.S.C. 154(b) by 26 days.

(21) Appl. No.: 14/526,224

(22) Filed: Oct. 28, 2014

(65) Prior Publication Data

US 2016/0118274 A1 Apr. 28, 2016

(51) Int. Cl.
*F26B 19/00* (2006.01)
*F26B 3/04* (2006.01)
*H01L 21/67* (2006.01)
*H01L 21/687* (2006.01)

(52) U.S. Cl.
CPC .......... *F26B 3/04* (2013.01); *H01L 21/67109* (2013.01); *H01L 21/68728* (2013.01); *H01L 21/68785* (2013.01)

(58) Field of Classification Search
CPC .......... F26B 19/00; F26B 21/00; C23F 1/00; C23F 1/08; B08B 13/00; B08B 3/00; B08B 3/02; H01L 21/00; H01L 21/0708
USPC ........ 34/380, 381, 58, 90, 18; 438/747, 748; 156/345.51, 345.55; 134/153, 157
See application file for complete search history.

(56) References Cited

U.S. PATENT DOCUMENTS

| | | | |
|---|---|---|---|
| 4,903,717 A * | 2/1990 | Sumnitsch | H01L 21/6708 118/52 |
| 6,536,454 B2 * | 3/2003 | Lindner | H01L 21/68728 134/153 |
| 7,837,803 B2 | 11/2010 | Hohenwarter | |
| 7,887,803 B2 * | 2/2011 | Cashman | G01N 33/573 424/139.1 |
| 7,891,314 B2 * | 2/2011 | Pichler | B05B 7/0416 118/300 |
| 8,596,623 B2 * | 12/2013 | Frank | H01L 21/67051 118/728 |
| 8,821,681 B2 * | 9/2014 | Puggl | H01L 21/67051 134/157 |
| 2008/0110861 A1 * | 5/2008 | Kajita | B08B 3/02 216/83 |
| 2010/0200163 A1 | 8/2010 | Puggi et al. | |
| 2011/0151675 A1 | 6/2011 | Frank et al. | |
| 2012/0080061 A1 * | 4/2012 | Kim | F26B 5/005 134/95.2 |
| 2014/0227884 A1 * | 8/2014 | Engesser | H01L 21/67248 438/747 |

FOREIGN PATENT DOCUMENTS

| | | | | |
|---|---|---|---|---|
| AT | KR 20140101315 A | * | 8/2014 | ......... H01L 21/6708 |
| WO | 2004/084278 | | 9/2004 | |
| WO | 2006/008236 | | 1/2006 | |
| WO | 2009/010394 | | 1/2009 | |

* cited by examiner

*Primary Examiner* — Stephen M Gravini

(57) ABSTRACT

An apparatus for processing wafer-shaped articles comprises a rotary chuck adapted to hold a wafer shaped article of a predetermined diameter in a predetermined orientation. The chuck includes a heater comprising a plurality of gas nozzles directed toward a surface of a wafer shaped article when held by the chuck. The heater comprises a gas inlet and at least one heating element for heating gas to be discharged through the plurality of gas nozzles. The heater is configured to heat a wafer shaped article principally by convective heat transfer from heated gas discharged through the plurality of gas nozzles.

19 Claims, 2 Drawing Sheets

CONVECTIVE WAFER HEATING BY IMPINGEMENT WITH HOT GAS

BACKGROUND OF THE INVENTION

1. Field of the Invention

The invention relates to a method and apparatus for liquid treatment of wafer-shaped articles, and more particularly relates to improved thermal management of wafer processing by utilizing heated gas to impart heat to a wafer-shaped article principally by convective heat transfer.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

As the wafer diameter increases, so too will the temperature differential between a liquid at the point where it is applied in a central region of the wafer and the same liquid after it has travelled radially outwardly to the periphery of the wafer. Such temperature differentials can contribute to damage to the device structures formed on the wafer, for example the damage phenomenon termed "pattern collapse."

The problem of pattern collapse becomes more serious as the aspect ratio of the submicroscopic structures continues to increase. This is also an ongoing trend in the manufacture of semiconductor devices, as the pressure to reduce device dimensions in general applies more to the horizontal layout and less to the thickness direction.

Conventional apparatus are equipped with infrared, LED or conductive heaters for heating a wafer so as to promote a uniform temperature distribution across the wafer surface. However, with IR heaters the heating is sensitive to wafer type, and may cause photo-corrosion of the traces in the wafer. Moreover, processing chemistries can be light sensitive, as well as components of process module. Additionally, very high temperatures of the heater filament are a safety concern.

With LED heaters, heating is also sensitive to wafer type, and the light sensitivity of processing chemistries and components of the process module area again of concern. Furthermore, the very high power densities of the individual LEDs can be challenging to cool effectively.

Conductive heaters are not thermally effective without a coupling fluid, and thermal mass is a concern.

SUMMARY OF THE INVENTION

Thus, in one aspect, the present invention relates to an apparatus for processing wafer-shaped articles, comprising a rotary chuck adapted to hold a wafer shaped article of a predetermined diameter in a predetermined orientation, and a heater comprising a plurality of gas nozzles directed toward a surface of a wafer shaped article when held by the chuck. The heater comprises a gas inlet and at least one heating element for heating gas to be discharged through the plurality of gas nozzles. The heater is configured to heat a wafer shaped article principally by convective heat transfer from heated gas discharged through the plurality of gas nozzles.

In preferred embodiments of the apparatus according to the present invention, the plurality of nozzles are oriented within 10° of perpendicular to a wafer shaped article when held by the chuck.

In preferred embodiments of the apparatus according to the present invention, the plurality of nozzles are positioned from 0.5-10 mm from a wafer shaped article when held by the chuck.

In preferred embodiments of the apparatus according to the present invention, the plurality of nozzles are positioned from 1-5 mm from a wafer shaped article when held by the chuck.

In preferred embodiments of the apparatus according to the present invention, the plurality of nozzles comprises from 50 to 5000 nozzles.

In preferred embodiments of the apparatus according to the present invention, the plurality of nozzles comprises from 500 to 3000 nozzles.

In preferred embodiments of the apparatus according to the present invention, each of the plurality of nozzles has a diameter in a range from 0.1 to 1.5 mm.

In preferred embodiments of the apparatus according to the present invention, the heater is configured to discharge heated gas through the plurality of nozzles at a gas velocity in a range from 2 m/s to 30 m/s.

In preferred embodiments of the apparatus according to the present invention, the heater is configured to maintain an internal operating gas pressure at an overpressure of 1 to 5 bar relative to atmospheric pressure.

In preferred embodiments of the apparatus according to the present invention, the heater remains stationary during rotation of the rotary chuck.

In preferred embodiments of the apparatus according to the present invention, the chuck comprises a body mounted for rotation relative to a stationary central post, and the heater is mounted to an upper part of the stationary central post so as to overlie the body and underlie a wafer shaped article when held by the chuck.

In preferred embodiments of the apparatus according to the present invention, the plurality of nozzles is arranged in a two-dimensional array that underlies greater than 90% of the predetermined diameter of a wafer shaped article when held by the chuck.

In preferred embodiments of the apparatus according to the present invention, a controller is provided for the heating element, the controller being configured to activate the heating element to heat gas supplied to the heater during a heating cycle, and to deactivate the heating element so as not to heat gas supplied to the heater during a cooling cycle.

In preferred embodiments of the apparatus according to the present invention, the rotary chuck comprises a circular series of peripheral pins for contacting a wafer shaped article in an edge region thereof, and the heater is positioned inside of the circular series of pins.

In preferred embodiments of the apparatus according to the present invention, the heater comprises a heating chamber downstream from an inlet of the heater and upstream of the plurality of nozzles, and the heating element is configured to heat gas in the chamber.

In preferred embodiments of the apparatus according to the present invention, the plurality of nozzles comprises at least one group of nozzles underlying a peripheral region of a wafer shaped article when positioned on the chuck, and at least one group of nozzles underlying a more central region of a wafer shaped article when positioned on the chuck, and the group of nozzles underlying a peripheral region is greater in number than the group of nozzles underlying a more central region.

In preferred embodiments of the apparatus according to the present invention, the heater has a maximum extent in a first direction perpendicular to a rotation axis of the chuck that is greater than 90% of the predetermined diameter, and a maximum extent in a second direction perpendicular to a rotation axis of the chuck and the first direction that is less than 50% of the predetermined diameter.

In preferred embodiments of the apparatus according to the present invention, the plurality of nozzles are formed in a plate that is opaque to radiation emitted by the heating element.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
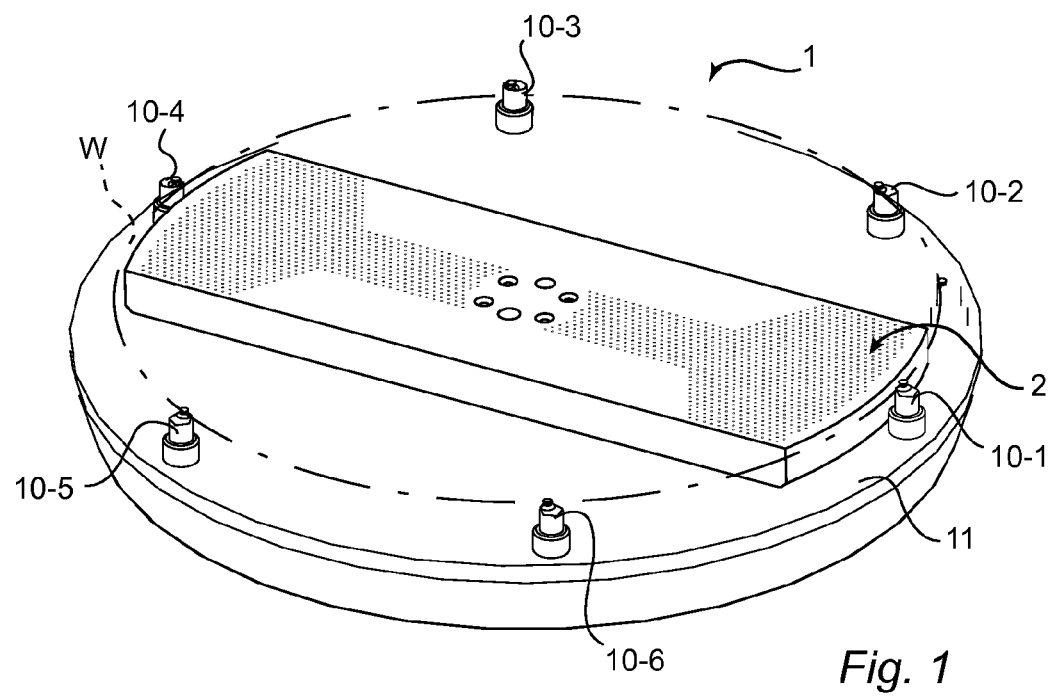
FIG. 1 is a schematic perspective view from above of a chuck according to a first embodiment of the invention.
Figure 2:
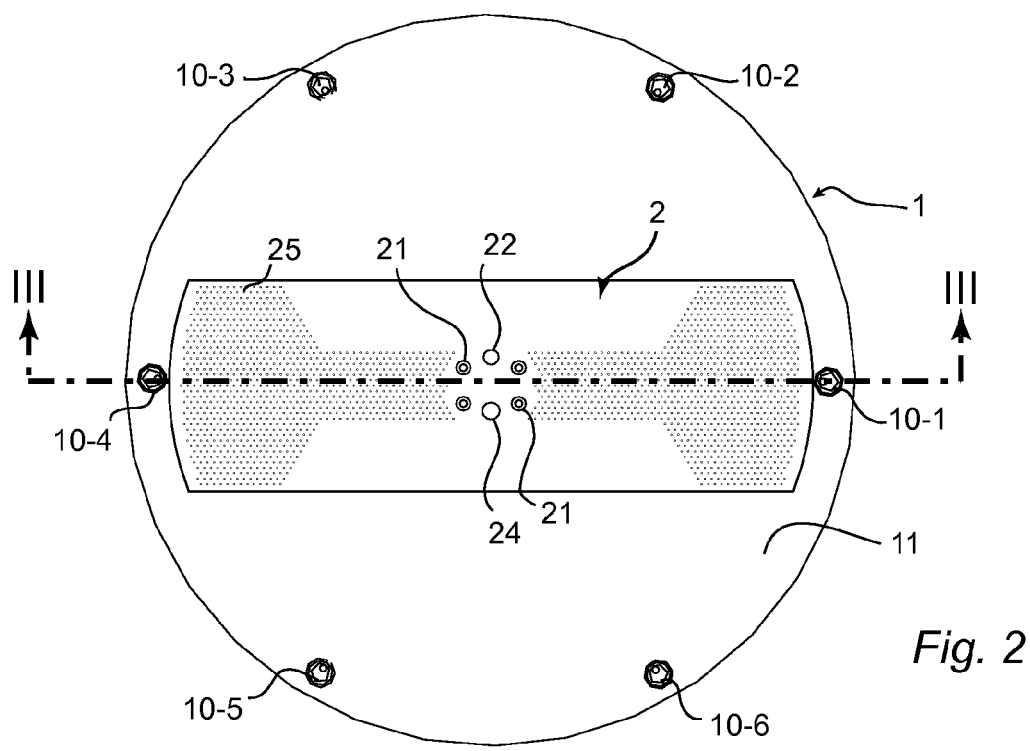
FIG. 2 is top plan view of the embodiment of FIG. 1.

Referring now to the drawings, FIGS. 1 and 2 depict a spin chuck 1 that holds a wafer thereon in a predetermined orientation, which is preferably such that the major surfaces of disposed horizontally or within ±20° of horizontal. Spin chuck 1 may for example be a chuck that operates according to the Bernoulli principle, as described for example in U.S. Pat. No. 4,903,717.

In the present embodiment, however, chuck 1 supports a wafer W via a series of gripping pins, which in this embodiment are six in number, designated 10-1 through 10-6. Gripping pins 10-1 to 10-6 prevent the wafer from sliding laterally off the chuck. In this embodiment, the upper portions of gripping pins 10-1 to 10-6 also provide subjacent support for wafer W, and thus the chuck need not operate according to the Bernoulli principle and need not be adapted to supply a gas cushion beneath wafer.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

Chuck 1 furthermore comprises a heating assembly 2 for heating the underside of a wafer mounted on the chuck. Heating assembly 2 is integrated with a stationary nozzle head 20 (see FIG. 3) that in this embodiment also supplies other fluids to the downwardly-facing side of the wafer W, for example through the nozzles 22, 24 shown in FIG. 2.

Heating assembly 2 is secured to the upper end of stationary nozzle head 20 for example by four bolts 21, as shown in FIG. 2. Heating assembly 2 comprises a large number of discharge openings 25, which open facing the underside of a wafer W when one is positioned on the chuck 1.

Figure 3:
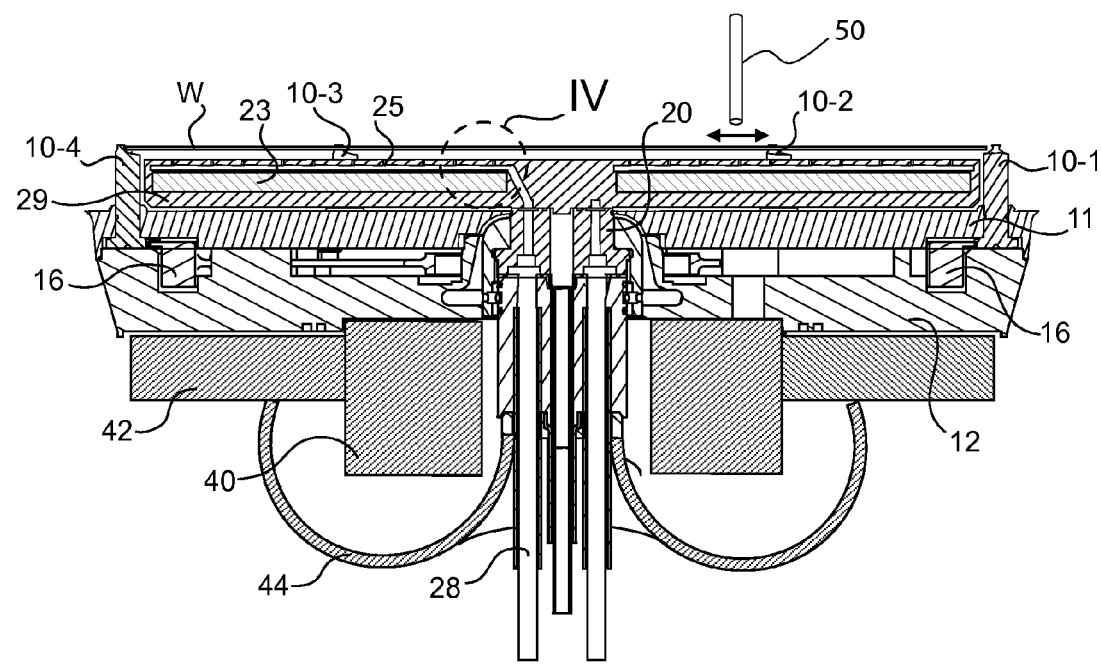
FIG. 3 is a partial axial section through the chuck depicted in FIGS. 1 and 2, taken along the line III-III of FIG. 2, with a wafer in position.

As shown in greater detail in FIG. 3, the heating assembly 2 comprises a main body 29 that is secured to the non-rotating (stationary) nozzle head 20. The main body 29 is spaced a small distance from the upper base body 11 of the spin chuck. The gripping pins 10-1 through 10-6 are mounted such that they rest on the lower base body 12 of the spin chuck 1, and extends upwardly through openings formed in the upper base body 11. The gripping pins 10-1 through 10-6 are positioned radially outwardly of the heating assembly 2. Thus, as the upper and lower base bodies 11, 12, gripping pins 10-1 through 10-6 and wafer W are driven in rotation during operation of the spin chuck 1, the heating assembly 2 remains stationary. Heating assembly 2 may thus be considered as being mounted in a cantilever fashion, wherein it is secured centrally and is spaced from both the overlying wafer W as well as from the rotating upper surface of chuck 1, while not being secured at its periphery. Main body 29 is therefore rigid enough that it does not contact either the rotating surfaces of the chuck or the wafer.

Spin chuck 1 is mounted to the rotor of a hollow-shaft motor 40 (schematically shown in FIG. 3), and the stationary nozzle head 20 penetrates through a central opening of the lower base body 12 of the spin chuck 1. The stator of the hollow-shaft motor 40 is mounted to the mounting plate 42 (schematically shown in FIG. 3). Nozzle head 20 and mounting plate 42 are mounted to the same stationary frame 44 (schematically shown in FIG. 3).

Gripping elements 10-1 to 10-6 are provided with eccentrically mounted grippers. The gripping elements are conjointly rotated about their cylindrical axes by a tooth gear 16 that is in meshing engaging with all of the gripping elements. The eccentric grippers are thus moved in concert between a radially inner closed position in which a wafer W is secured, to a radially outer open position in which the wafer W is released. Gripping elements 10-1 to 10-6 can be made as described in commonly-owned U.S. application Ser. No. 12/668,940 (corresponding to WO 2009/010394, or as described in commonly-owned U.S. application Ser. No. 12/642,117, filed Dec. 18, 2009). Gripping elements 10-1 to 10-6 thus comprise an eccentric uppermost portion that contacts wafer W, projecting from a base that is mounted for pivotal movement about its central axis. In particular, a ring gear 16 is centered on the underside of the upper body 11, and simultaneously engages via its peripheral gear teeth with gear teeth formed on the base of each of the pins 10-1 to 10-6. Pins 10-1 to 10-6 are evenly distributed about the periphery of spin chuck 1, with at least three and preferably six such pins 10 being provided.

An upper liquid dispenser 50 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 50 is preferably displaceable radially of the wafer W, to aid in spreading treatment liquid over the entire upwardly facing surface of wafer W as it is rotated on the spin chuck.

Figure 4:
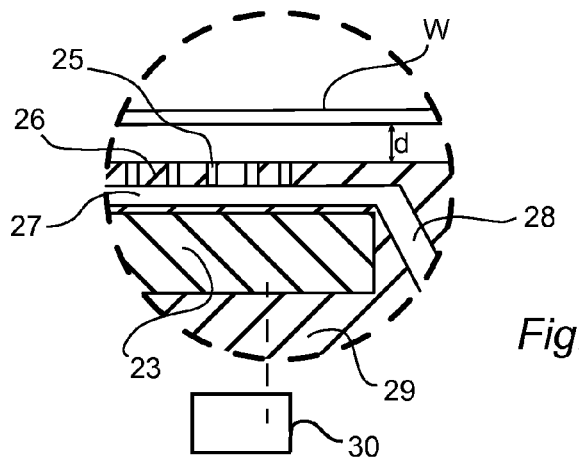
FIG. 4 is an enlarged view of the detail IV designated in FIG. 3.

In the detail of FIG. 4, it can be seen that the heating assembly 2 comprises a heating element 23 incorporated within the main body 29 of the heating assembly. Heating element 23 is preferably an electrical resistance heating element, and in practice a plurality of such heating elements 23 are preferably provided. Heating element 23 is switched on and off by a controller 30, which is operated in accordance with the processing being carried out on the spin chuck 1.

The heating assembly 2 furthermore comprises at least one supply conduit 28, which is a continuation of the supply conduit that is shown in FIG. 3 passing through the stationary nozzle 20. Conduit 28 supplies a gas to be heated to the heating assembly 2, and more specifically to an internal chamber 27 beneath which the heating element 23 is positioned, and above which a plate 26 is positioned, which plate 26 has formed therein the discharge orifices or nozzles 25.

The apparatus as described herein is configured to heat a wafer W principally by convective heat transfer. To that end, heating assembly 2 is configured such that the heated gas discharged through the discharge nozzles 25 is caused to impinge on the downwardly-facing surface of a wafer W mounted on chuck 1.

Thus, the orientation of nozzles 25 is preferably perpendicular to the lower major surface of wafer W, and preferably the axes of nozzles 25 do not deviate from perpendicular by more than +/−10°. Furthermore, there is preferably a large number of the nozzles 25, for example, from 50 to 5000 nozzles, preferably from 500 to 3000 nozzles, and still more preferably from 1000 to 2500 nozzles.

The spacing between the openings of nozzles 25 and the plane that will be occupied by a wafer W when mounted on the chuck is illustrated by the gap "d" shown in FIG. 4. That spacing is preferably 0.5-10 mm, and more preferably 1-5 mm. The diameter of nozzles 25 is preferably from 0.1 mm to 1.5 mm, and more preferably from 0.5 to 1.0 mm.

The supply of gas through conduit 28 and into chamber 27 is preferably effected at a flow rate that serves to maintain an internal operating gas pressure within chamber 27 at an overpressure of 1 to 5 bar relative to atmospheric pressure. The heated gas is preferably discharged through the nozzles 25 at a gas velocity in a range from 2 m/s to 30 m/s.

Plate 26 is preferably formed of a material that is opaque to the radiation emitted by heating element 23, which in this embodiment contributes to the wafer W being heated principally by convective heat transfer from the heated gas impinging on the underside of the wafer W. Nitrogen is preferred for use as the heated gas.

As can be seen in FIGS. 1 and 2, nozzles 25 are in this embodiment arranged in a two-dimensional array that, in its principal direction underlies greater than 90% of the diameter of wafer W. On the other hand, in the perpendicular direction of the array, its maximum extent is less than 50% of the diameter wafer W.

Furthermore, the array as shown in FIGS. 1 and 2 is of a dogbone shape, with a majority of the nozzles 25 being in the wider opposite peripheral regions of the array, and a minority of the nozzles 25 being in the narrower central region of the array.

Another advantage of the apparatus described herein is that the controller 30 may be configured to activate the heating element 23 to heat nitrogen gas supplied to heating assembly 2 during a heating cycle, and to deactivate the heating element (while nitrogen gas is still supplied to the heating assembly 2), so as not to heat gas supplied to the heating assembly 2 during a cooling cycle.

In operation, the wafer W is heated by gas which is blown onto the wafer from an array of impinging jet flows issuing from nozzles 25. The effectiveness of the impinging is mainly a function of the physical design of the array and the properties of the gas. The array design and gas properties can thus be modified to achieve any particular wafer temperature profile even considering competing wafer heating and cooling loads.

Impinging is a form of convective heat transfer that is relatively insensitive to the material of the wafer to be processed. Therefore, the process gas can be the same as typically used in semiconductor fabs. Moreover, the effective heat transfer from impinging is very high, and the gas temperatures therefore need be only slightly higher than the desired wafer temperature. This consequently minimizes safety concerns and maximizes compatible material choice. Still further, since the process gas may be supplied to the heating assembly 2 at room temperature, the same equipment may be used to cool a wafer W simply by switching off the heating element 23.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for processing wafer-shaped articles, comprising a rotary chuck adapted to hold a wafer shaped article of a predetermined diameter in a predetermined orientation, and a heater comprising a plurality of gas nozzles directed toward a surface of a wafer shaped article when held by said chuck, said heater comprising a gas inlet and at least one heating element for heating gas to be discharged through said plurality of gas nozzles, said heater being configured to heat a wafer shaped article principally by convective heat transfer from heated gas discharged through said plurality of gas nozzles; wherein said plurality of nozzles are positioned from 0.5-10 mm from a wafer shaped article when held by said chuck.

2. The apparatus according to claim 1, wherein said plurality of nozzles are oriented within 10° of perpendicular to a wafer shaped article when held by said chuck.

3. The apparatus according to claim 1, wherein said plurality of nozzles are positioned from 1-5 mm from a wafer shaped article when held by said chuck.

4. The apparatus according to claim 1, wherein said plurality of nozzles comprises from 50 to 5000 nozzles.

5. The apparatus according to claim 1, wherein said plurality of nozzles comprises from 500 to 3000 nozzles.

6. The apparatus according to claim 1, wherein each of said plurality of nozzles has a diameter in a range from 0.1 to 1.5 mm.

7. The apparatus according to claim 1, wherein said heater is configured to discharge heated gas through said plurality of nozzles at a gas velocity in a range from 2 m/s to 30 m/s.

8. The apparatus according to claim 1, wherein said heater is configured to maintain an internal operating gas pressure at an overpressure of 1 to 5 bar relative to atmospheric pressure.

9. The apparatus according to claim 1, wherein said heater remains stationary during rotation of said rotary chuck.

10. The apparatus according to claim 1, wherein said chuck comprises a body mounted for rotation relative to a stationary central post, and wherein said heater is mounted to an upper part of said stationary central post so as to overlie said body and underlie a wafer shaped article when held by said chuck.

11. The apparatus according to claim 1, wherein said plurality of nozzles is arranged in a two-dimensional array that underlies greater than 90% of the predetermined diameter of a wafer shaped article when held by said chuck.

12. The apparatus according to claim 1, further comprising a controller for said heating element that is configured to activate said heating element to heat gas supplied to said heater during a heating cycle, and to deactivate said heating element so as not to heat gas supplied to said heater during a cooling cycle.

13. The apparatus according to claim 1, wherein said rotary chuck comprises a circular series of peripheral pins for contacting a wafer shaped article in an edge region thereof, and wherein said heater is positioned inside of said circular series of pins.

14. The apparatus according to claim 1, wherein said heater comprises a heating chamber downstream from an inlet of said heater and upstream of said plurality of nozzles, and wherein said heating element is configured to heat gas in said chamber.

15. The apparatus according to claim 1, wherein said plurality of nozzles comprises at least one group of nozzles underlying a peripheral region of a wafer shaped article when positioned on said chuck, and at least one group of nozzles underlying a more central region of a wafer shaped article when positioned on said chuck, and wherein the group of nozzles underlying a peripheral region is greater in number than the group of nozzles underlying a more central region.

16. The apparatus according to claim 1, wherein said heater has a maximum extent in a first direction perpendicular to a rotation axis of said chuck that is greater than 90% of said predetermined diameter, and a maximum extent in a second direction perpendicular to a rotation axis of said chuck and said first direction that is less than 50% of said predetermined diameter.

17. The apparatus according to claim 1, wherein said plurality of nozzles are formed in a plate that is opaque to radiation emitted by said heating element.

18. Apparatus for processing wafer-shaped articles, comprising a rotary chuck adapted to hold a wafer shaped article of a predetermined diameter in a predetermined orientation, and a heater comprising a plurality of gas nozzles directed toward a surface of a wafer shaped article when held by said chuck, said heater comprising a gas inlet and at least one heating element for heating gas to be discharged through said plurality of gas nozzles, said heater being configured to heat a wafer shaped article principally by convective heat transfer from heated gas discharged through said plurality of gas nozzles; wherein said plurality of nozzles comprises from 50 to 5000 nozzles.

19. Apparatus for processing wafer-shaped articles, comprising a rotary chuck adapted to hold a wafer shaped article of a predetermined diameter in a predetermined orientation, and a heater comprising a plurality of gas nozzles directed toward a surface of a wafer shaped article when held by said chuck, said heater comprising a gas inlet and at least one heating element for heating gas to be discharged through said plurality of gas nozzles, said heater being configured to heat a wafer shaped article principally by convective heat transfer from heated gas discharged through said plurality of gas nozzles; wherein each of said plurality of nozzles has a diameter in a range from 0.1 to 1.5 mm.

* * * * *